United States Patent
Glazewski et al.

(10) Patent No.: US 10,504,567 B2
(45) Date of Patent: *Dec. 10, 2019

(54) SENSE AMPLIFIER WITH OFFSET COMPENSATION

(71) Applicant: TEXAS INSTRUMENTS INCORPORATED, Dallas, TX (US)

(72) Inventors: Robert Antonio Glazewski, Dallas, TX (US); Stephen Keith Heinrich-Barna, Murphy, TX (US); Saim Ahmad Qidwai, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/263,184

(22) Filed: Jan. 31, 2019

(65) Prior Publication Data

US 2019/0164579 A1    May 30, 2019

Related U.S. Application Data

(63) Continuation of application No. 15/585,332, filed on May 3, 2017, now Pat. No. 10,199,078, which is a continuation of application No. 14/834,754, filed on Aug. 25, 2015, now Pat. No. 9,704,554.

(51) Int. Cl.
| | | |
|---|---|---|
| *G11C 11/22* | (2006.01) | |
| *G11C 7/06* | (2006.01) | |
| *H03F 1/02* | (2006.01) | |
| *H03F 3/16* | (2006.01) | |
| *G11C 7/10* | (2006.01) | |

(52) U.S. Cl.
CPC ............ *G11C 7/065* (2013.01); *G11C 11/221* (2013.01); *G11C 11/2273* (2013.01); *H03F 1/0205* (2013.01); *H03F 3/16* (2013.01); *G11C 7/10* (2013.01); *G11C 11/223* (2013.01)

(58) Field of Classification Search
CPC .... G11C 11/2273; G11C 11/221; G11C 11/22
USPC ....................................................... 365/145
See application file for complete search history.

(56) References Cited

U.S. PATENT DOCUMENTS

| | | |
|---|---|---|
| 5,889,695 A | 3/1999 | Kawagoe |
| 6,339,559 B1 | 1/2002 | Bertin et al. |
| 6,459,609 B1 | 10/2002 | Du |
| 6,584,003 B1 | 6/2003 | Kim et al. |
| 2004/0178849 A1 | 9/2004 | Kimura |
| 2005/0190618 A1 | 9/2005 | Kikutake et al. |
| 2009/0034338 A1 | 2/2009 | Lin et al. |
| 2010/0128513 A1 | 5/2010 | Nishimura et al. |
| 2012/0294090 A1* | 11/2012 | Chang ............... G11C 16/06 365/185.21 |

(Continued)

*Primary Examiner* — Huan Hoang
*Assistant Examiner* — Muna A Techane
(74) *Attorney, Agent, or Firm* — Kenneth Liu; Charles A. Brill; Frank D. Cimino (57) ABSTRACT

An integrated circuit device is disclosed that includes an sense amplifier having first and second input terminals, a compensation network including a first compensation circuit coupled to the first input terminal of the sense amplifier and a second compensation circuit coupled to the second input terminal of the sense amplifier, and a latch circuit operable to selectively enable either one of the first and second compensation circuits, but not both of the first and second compensation circuits simultaneously.

19 Claims, 8 Drawing Sheets

(56) References Cited

U.S. PATENT DOCUMENTS

2013/0058172 A1* 3/2013 Rao ................... G11C 29/026
  365/189.05

* cited by examiner

SENSE AMPLIFIER WITH OFFSET COMPENSATION

CROSS-REFERENCE TO RELATED APPLICATION(S)

This application is a continuation of U.S. patent application Ser. No. 15/585,332 filed May 3, 2017 (now U.S. Pat. No. 10,199,078), which is a continuation of U.S. patent application Ser. No. 14/834,754 filed on Aug. 25, 2015 (now U.S. Pat. No. 9,704,554), the entireties of which is incorporated herein by reference.

BACKGROUND

Nonvolatile memory circuits such as electrically erasable programmable read only memories (EEPROM) and Flash EEPROMs have been widely used for several decades in various circuit applications including computer memory, automotive applications, and cell phones. Each of these nonvolatile memory circuits has at least one nonvolatile memory element such as a floating gate, silicon nitride layer, programmable resistance, or other nonvolatile memory element that maintains a data state when an operating voltage is removed. Many new applications, however, require the access time and packing density of previous generation nonvolatile memories in addition to low power consumption for battery powered circuits. One nonvolatile memory technology that is particularly attractive for these low power applications is the ferroelectric memory cell, which uses a ferroelectric capacitor for a nonvolatile memory element. A major advantage of these ferroelectric memory cells is that they require approximately three orders of magnitude less energy for write operations than previous generation floating gate memories. Furthermore, they do not require high voltage power supplies for programming and erasing charge stored on a floating gate. Thus, circuit complexity is reduced and reliability increased.

Figure 1:
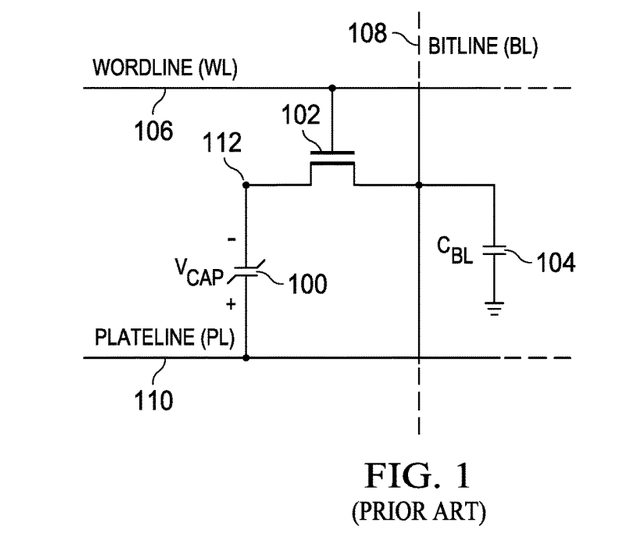
FIG. 1 is a circuit diagram of a ferroelectric memory cell of the prior art.

A typical one-transistor, one-capacitor (1T1C) ferroelectric memory cell of the prior art is illustrated at FIG. 1. The ferroelectric memory cell is similar to a 1T1C dynamic random access memory (DRAM) cell except for ferroelectric capacitor 100. The ferroelectric capacitor 100 is connected between plate line 110 and storage node 112. Access transistor 102 has a current path connected between bit line 108 and storage node 112. A control gate of access transistor 102 is connected to word line 106 to control reading and writing of data to the ferroelectric memory cell. This data is stored as a polarized charge corresponding to cell voltage $V_{CAP}$. Capacitance of bit line BL is represented by capacitor $C_{BL}$ 104.

Figure 2:
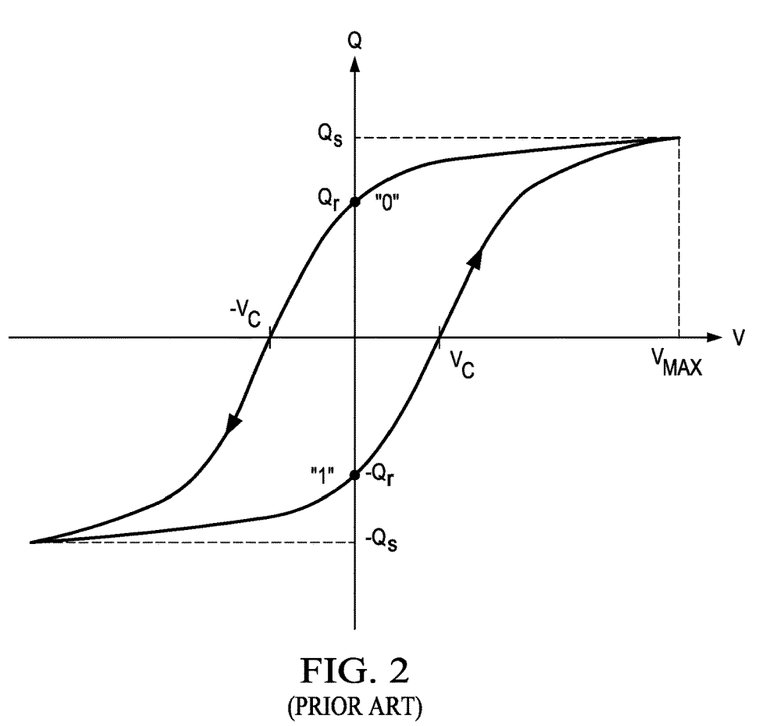
FIG. 2 is a hysteresis curve of the ferroelectric capacitor 100 of FIG. 1.

Referring to FIG. 2, there is a hysteresis curve corresponding to the ferroelectric capacitor 100. The hysteresis curve includes net charge Q or polarization along the vertical axis and applied voltage along the horizontal axis. By convention, the polarity of the ferroelectric capacitor voltage is defined as shown in FIG. 1. A stored "0", therefore, is characterized by a positive voltage at the plate line terminal with respect to the access transistor terminal. A stored "1" is characterized by a negative voltage at the plate line terminal with respect to the access transistor terminal. A "0" is stored in a write operation by applying a voltage Vmax across the ferroelectric capacitor. This stores a saturation charge Qs in the ferroelectric capacitor. The ferroelectric capacitor, however, includes a linear component in parallel with a switching component. When the electric field is removed, therefore, the linear component discharges, but the residual charge Qr remains in the switching component. The stored "0" is rewritten as a "1" by applying −Vmax to the ferroelectric capacitor. This charges the linear and switching components of the ferroelectric capacitor to a saturation charge of −Qs. The stored charge reverts to −Qr when the voltage across the ferroelectric capacitor is removed. Coercive points $V_C$ and $-V_C$ are minimum voltages on the hysteresis curve that will degrade a stored data state. For example, application of $V_C$ across a ferroelectric capacitor will degrade a stored "1" even though it is not sufficient to store a "0". Thus, it is particularly important to avoid voltages near these coercive points unless the ferroelectric capacitor is being accessed.

As memory cell feature sizes are reduced with advancing technology, both saturation charge and coercive voltage available for sensing are also reduced. Moreover, small process variations in transistor gate length, dielectric thickness, electrode spacing and other factors may create an imbalance in bit line capacitance and sense amplifier offset voltage. Due to the relatively large number of memory cells on each bit line, the average difference may be small. With individual sense amplifiers, however, even small process variations may create a significant offset voltage and corresponding reduction in signal-to-noise ratio.

BRIEF SUMMARY

In a first embodiment of the present invention, an amplifier circuit with first and second input terminals is disclosed. A first compensation circuit is coupled to the first input terminal, and a second compensation circuit is coupled to the second input terminal. A programmable latch circuit receives data from a nonvolatile memory array to select one of the first and second compensation circuits.

In a second embodiment of the present invention, an amplifier circuit with first and second input terminals is disclosed. A first compensation circuit is coupled to the first input terminal, and a second compensation circuit is coupled to the second input terminal. A programmable latch circuit receives data from an electronic fuse circuit to select one of the first and second compensation circuits.

DETAILED DESCRIPTION

Preferred embodiments of the present invention provide significant advantages in sense amplifier voltage offset through utilization of compensation. Embodiments of the present invention may be applied to any memory circuit such as ferroelectric memory circuits, static random access memory circuits, resistive random access memory circuits, magnetic random access memory circuits, or any other memory circuit that may use a sense amplifier for data amplification.

Figure 3:
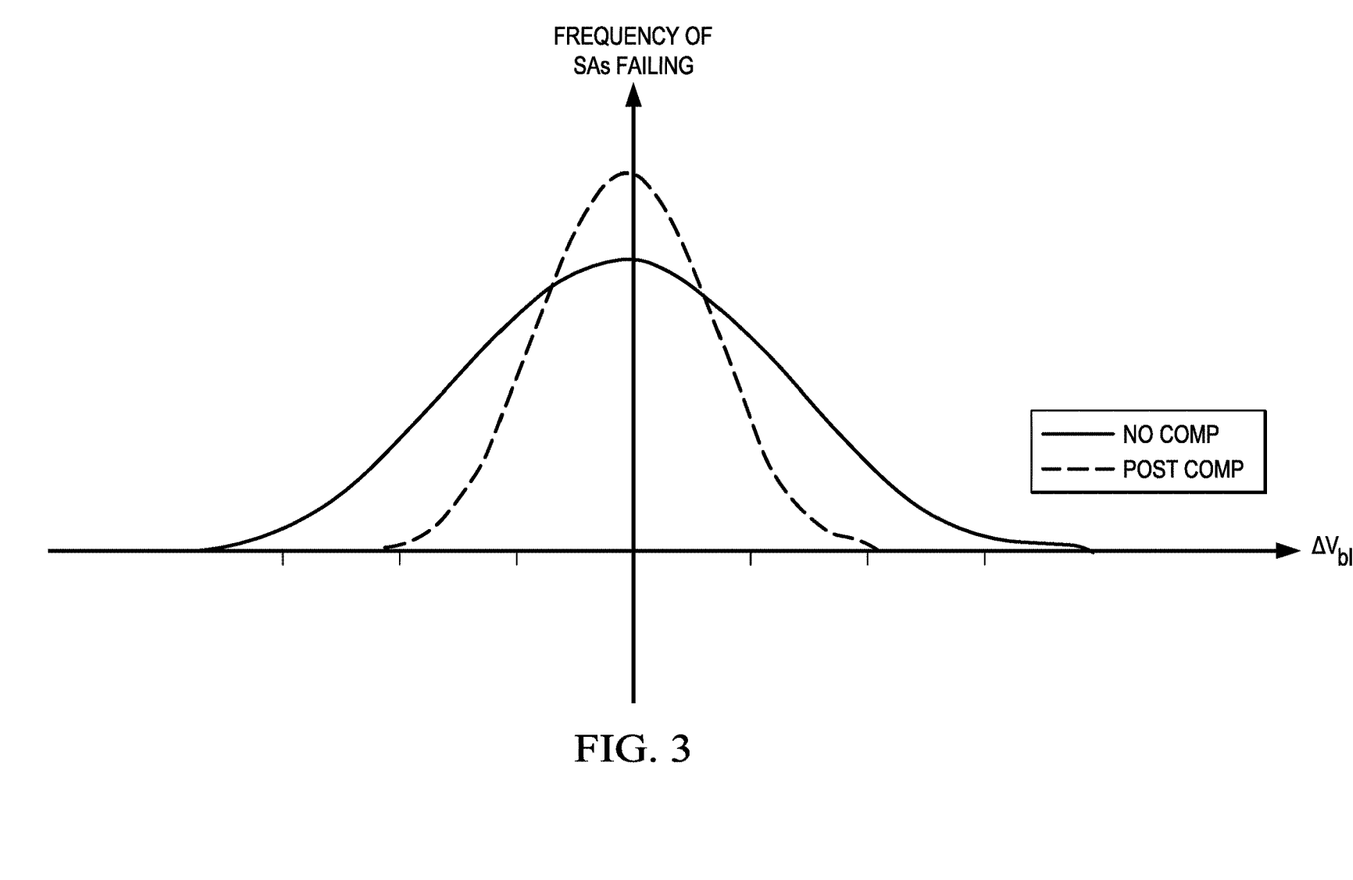
FIG. 3 is a diagram showing sense amplifier error frequency as a function of differential input voltage for uncompensated and compensated sense amplifiers.

Referring to FIG. 3, there is a diagram showing sense amplifier error frequency as a function of differential input voltage for uncompensated (NO COMP) and compensated (POST COMP) sense amplifiers. The horizontal axis is a difference voltage ($\Delta Vbl$) at the input of the sense amplifiers. The vertical axis shows a frequency of failed sense amplifier reads in a normal distribution as a function of the differential input voltage. At the center of the diagram, both compensated and uncompensated sense amplifiers have a maximum number of read errors. In other words, when there is no difference voltage both compensated and uncompensated sense amplifiers produce read errors. For increasingly positive and negative difference voltages, the number of read errors decreases significantly. The sample of uncompensated sense amplifiers has a greater standard deviation than the post compensation sample. Moreover, the post compensation sample of sense amplifiers provides significantly fewer read errors for smaller $\Delta Vbl$. It is highly advantageous, therefore, to employ sense amplifier compensation according to the present invention to increase the signal-to-noise ratio and reduce read errors.

Figure 4A:
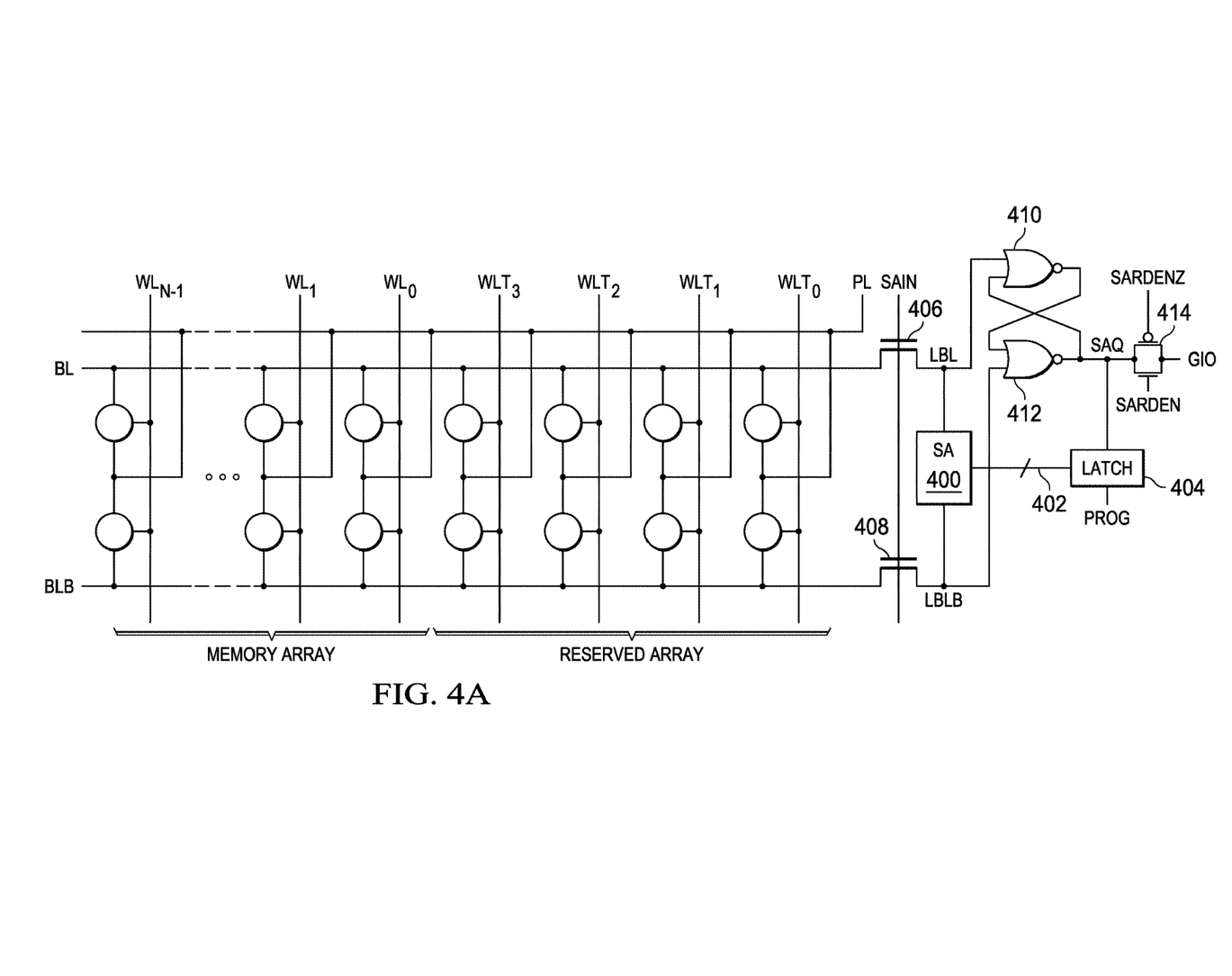
FIG. 4A is a schematic diagram of a memory array according to a first embodiment of the present invention.

Referring next to FIG. 4A, there is a schematic diagram of a memory array according to a first embodiment of the present invention. Here and in the following discussion, the same reference numerals and names are used to indicate substantially the same elements. The memory array illustrates a column of two-transistor, two-capacitor (2T2C) memory cells divided into normal and reserved memory arrays. In a practical memory circuit there are many such columns of memory cells but only one is illustrated here by way of explanation. The memory cells are coupled between bit line BL and complementary bit line BLB. The 2T2C memory cells may be ferroelectric memory (FRAM) cells or other nonvolatile memory cells. Here, nonvolatile means the memory cell retains data when power is removed. Correspondingly, volatile memory cells such as static random access memory (SRAM) cells or dynamic random access memory (DRAM) cells do not retain data when power is removed. The normal memory array includes N rows of memory cells responsive to respective word lines $WL_0$ through $WL_{N-1}$. The reserved memory array includes four rows of memory cells responsive to respective trim word lines $WLT_0$ through $WLT_3$. The reserved memory cells store data to compensate the sense amplifier as will be explained in detail.

Sense amplifier 400 is connected to local bit line (LBL) and complementary local bit line (LBLB) and coupled to BL and BLB by respective n-channel input transistors 406 and 408. LBL and LBLB are coupled to cross-coupled NOR gates 410 and 412 which produce output data signal SAQ at the output of NOR gate 412. Output signal SAQ is selectively applied to a global input-output (GIO) lead by complementary metal oxide semiconductor (CMOS) transmission gate 414 in response to sense amplifier read enable signal SARDEN and complementary sense amplifier read enable signal SARDENZ. Sense amplifier 400 is compensated by signals from programmable latch circuit 404 via bus 402.

During power up of the memory array, trim word lines $WLT_0$ through $WLT_3$ are sequentially activated, and input transistors 406 and 408 apply respective data signals from the reserved array to sense amplifier 400. Timing during the power up sequence is preferably relaxed with respect to normal operation to facilitate reading data before sense amplifier 400 is compensated. As each bit is sequentially read from the reserved array, it is stored in the cross-coupled latch formed by NOR gates 410 and 412. Sequential output signals SAQ are stored in respective latches of latch circuit 404 as they are selected by programming signals PROG. Other columns of memory cells connected to trim word lines $WLT_0$ through $WLT_3$ operate in parallel to store their reserved array data in their respective latch circuits. After power up is complete, latch circuit 404 stores the four bits from the reserved array in a respective latch of latch circuit 404 while power is applied to the memory array. These four bits are applied to sense amplifier 400 to compensate for sense amplifier offset voltage as will be explained in detail.

Figure 4B:
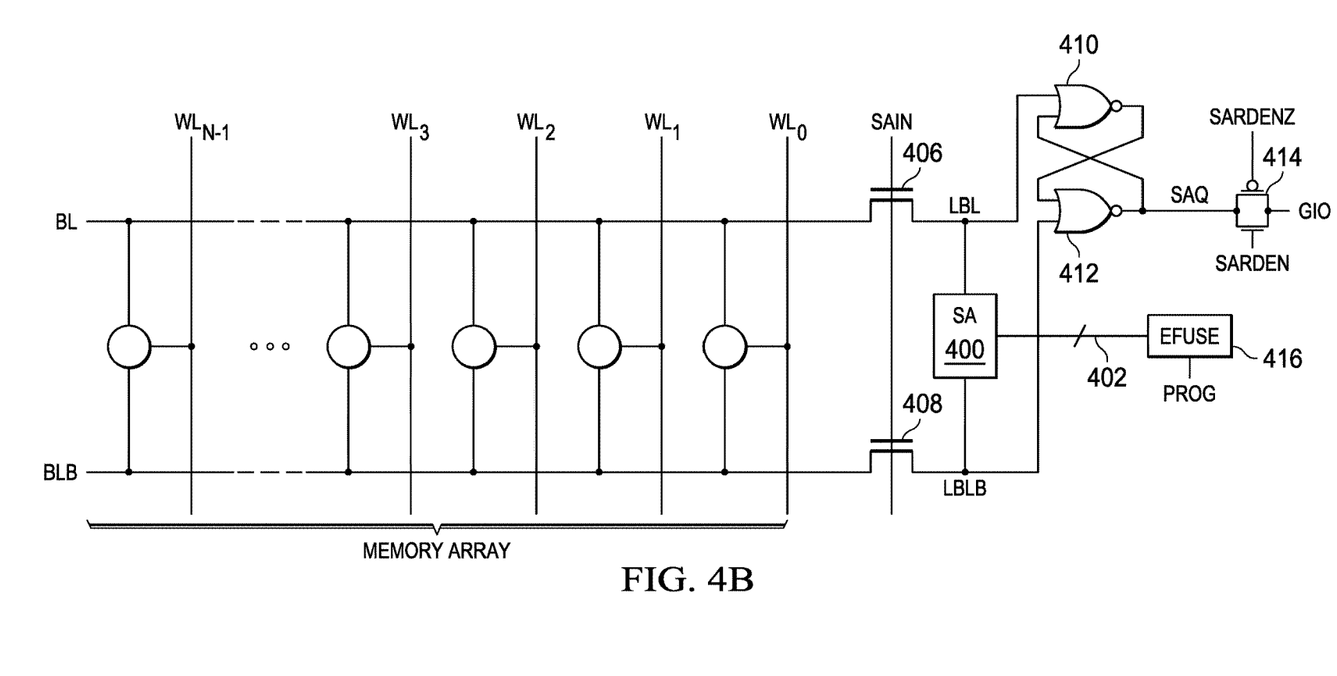
FIG. 4B is a schematic diagram of a memory array according to a second embodiment of the present invention.

Referring next to FIG. 4B, there is a schematic diagram of a memory array according to a second embodiment of the present invention. The memory array of FIG. 4B may be a static random access memory (SRAM) or other volatile or nonvolatile memory array and does not require a separate reserved array as in FIG. 4A. In a practical memory circuit there are many such columns of memory cells but only one is illustrated by way of explanation. The memory cells are coupled between bit line BL and complementary bit line BLB. The memory array includes N rows of memory cells responsive to respective word lines $WL_0$ through $WL_{N-1}$.

Sense amplifier 400 is connected to local bit line (LBL) and complementary local bit line (LBLB) and coupled to BL and BLB by respective n-channel input transistors 406 and 408. LBL and LBLB are coupled to cross-coupled NOR gates 410 and 412 which produce output data signal SAQ at the output of NOR gate 412. Output signal SAQ is selectively applied to a global input-output (GIO) lead by complementary metal oxide semiconductor (CMOS) transmission gate 414 in response to sense amplifier read enable signal SARDEN and complementary sense amplifier read enable signal SARDENZ. Sense amplifier 400 is compensated by signals from EFUSE circuit 416 via bus 402. EFUSE circuit 416 preferably includes four electronically programmed fuses and their respective fuse latches. The fuses may be nonconductive when programmed (eFUSE) or conductive when programmed (antifuse). For either type fuse, the corresponding data state is stored in a respective fuse latch in response to programming signals PROG. These four bits are applied to sense amplifier 400 to compensate for sense amplifier offset voltage as will be explained in detail.

Figure 5:
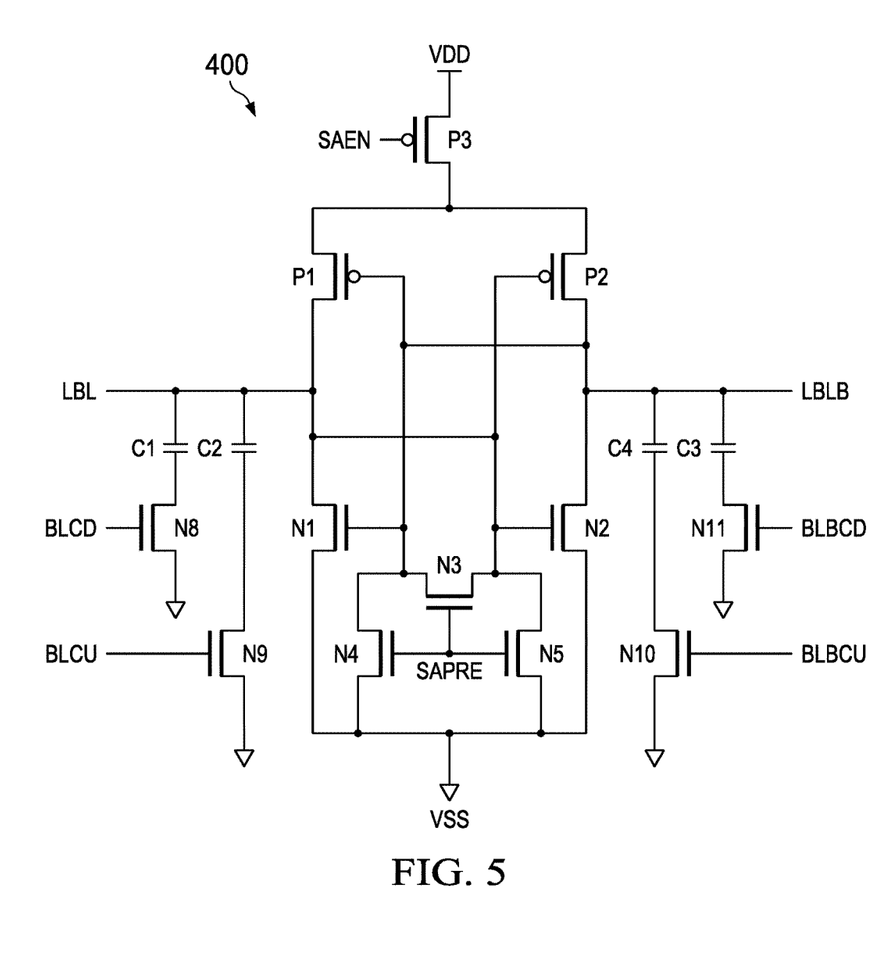
FIG. 5 is a schematic diagram of a compensated sense amplifier according to the present invention that may be used in the memory circuits of FIG. 4A or 4B.

Turning now to FIG. 5, there is a schematic diagram of a compensated sense amplifier according to the present invention that may be used in the memory circuits of FIG. 4A or 4B. The sense amplifier circuit includes a sense amplifier formed by p-channel transistors P1 and P2 and n-channel transistors N1 and N2 connected in a cross-coupled configuration. The sense amplifier is precharged to reference voltage VSS by a precharge circuit formed by n-channel transistors N3-N5 in response to a high level of precharge signal SAPRE. The sense amplifier operates in a low-going-high mode and is activated by a low level of sense amplifier enable signal SAEN applied to a control gate of p-channel transistor P3.

The sense amplifier circuit of FIG. 5 includes a compensation network formed by capacitors C1-C4 and respective n-channel switching transistors N8-N11. Four capacitors are illustrated in the compensation network by way of example, but any practical number may be used as long as symmetry is maintained. The n-channel switching transistors are selectively enabled by respective control signals from latch circuit 404 (FIG. 4A) or EFUSE circuit 416 (FIG. 4B). When any of N8-N11 are enabled by respective control signals from latch circuit 404 (FIG. 4A) or EFUSE register 416 (FIG. 4B), they couple their respective series-connected capacitor to VSS or other suitable reference terminal, thereby adding capacitance to LBL or LBLB. The compensation capacitors C1-C4 may be small metal-to-metal or metal-to-polycrystalline silicon capacitors on the order of a few femto farads. They may be of equal value, have binary weighting, or other suitable values. For example, C1 may be equal to C2. Alternatively, binary weighting may be used so that C1 may be 1 fF and C2 may be 2 fF to permit addition of 1, 2, or 3 fF to either LBL or LBLB. Selective addition of this capacitance advantageously compensates for either static or dynamic offset voltage in the sense amplifier circuit. For example, if LBLB has slightly more capacitance than LBL, the sense amplifier may produce a high level of LBL and a low level of LBLB even when the initial input voltage of LBLB is positive with respect to LBL. This static voltage offset may be compensated by enabling N8, N9, or both thereby adding the appropriate capacitance of C1, C2, or both to LBL. In this case N10 and N11 remain off, so no compensation capacitance is added to LBLB. As a further example, if the gain of p-channel transistor P1 is slightly greater than the gain of p-channel transistor P2, the sense amplifier may produce a high level of LBL and a low level of LBLB even when the initial input voltage of LBLB is positive with respect to LBL. This dynamic voltage offset may be compensated by enabling N8, N9, or both thereby adding the appropriate capacitance of C1, C2, or both to LBL. In this case N10 and N11 remain off, so no compensation capacitance is added to LBLB. According to the present invention, therefore, sense amplifier circuit 400 may be compensated for voltage offset produced by either static or dynamic imbalance.

Figure 6:
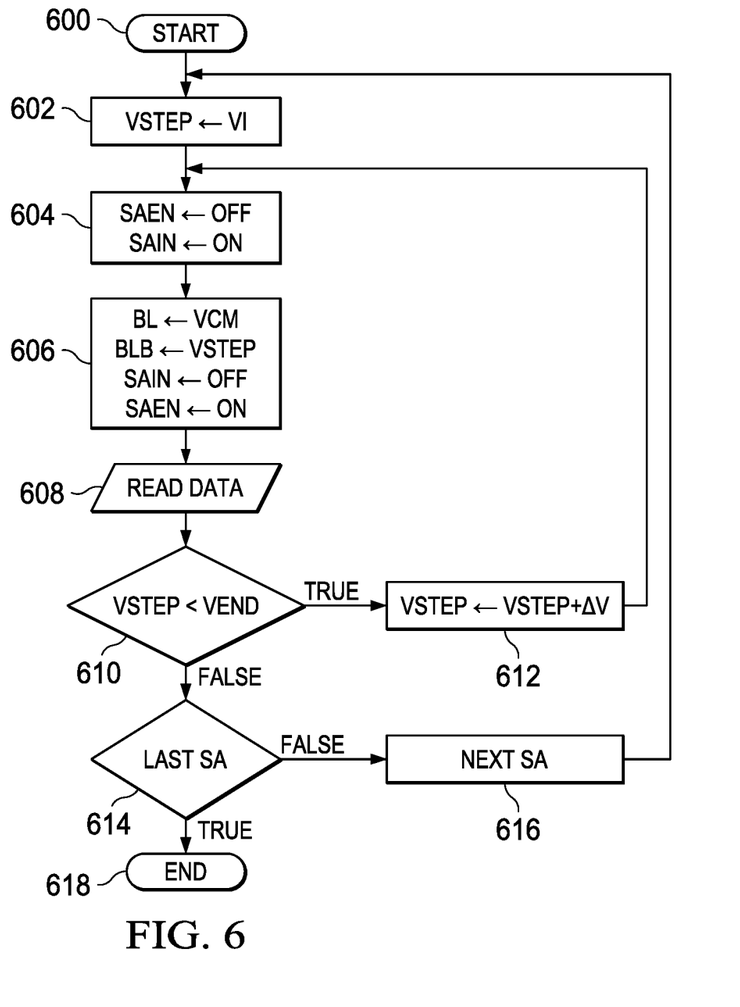
FIG. 6 is a flow chart illustrating sense amplifier offset voltage determination according to the present invention.

Referring to FIG. 6, there is a flow chart illustrating the method of determining sense amplifier offset and compensation according to the present invention. The method starts at step 600 with an initial sense amplifier circuit. Step voltage VSTEP is set to an initial voltage VI at step 602. At step 604 sense amplifier enable signal SAEN is high and p-channel transistor P3 is off. Sense amplifier input signal SAIN is also high, and n-channel transistors 406 and 408 are on. At step 606, bit line BL is set to common mode voltage VCM and complementary bit line BLB is set to VSTEP. These voltages are applied to LBL and LBLB via n-channel transistors 406 and 408, respectively. Then SAIN is set to a low level, thereby turning off n-channel transistors 406 and 408 and isolating the applied difference voltage from BL and BLB on LBL and LBLB, respectively. SAEN is then taken low to turn on p-channel transistor P3 and activate the sense amplifier. At step 608, amplified data signal GIO is read along the normal data path and stored. Decision step 610 tests whether voltage VSTEP is less than end voltage VEND. If so, control transfers to step 612 where VSTEP is incremented by voltage ΔV. Control is then transferred to step 604 and the process is repeated for the new VSTEP voltage. The process continues and read data is stored at step 608 for each subsequent value of VSTEP until it is equal to or greater than end voltage VEND. Then control is transferred from decision step 614 to step 616 where a next sense amplifier is selected. In this manner, each sense amplifier offset voltage is determined by the symmetry of the normal distribution. Referring back to the diagram of FIG. 3 for example, the maximum error frequency should occur when VSTEP is equal to VCM if the sense amplifier has zero voltage offset. If there is a voltage offset, however, the maximum error frequency will be displaced by that offset voltage to the left (negative) or right (positive) with respect zero input difference voltage.

Figure 7:
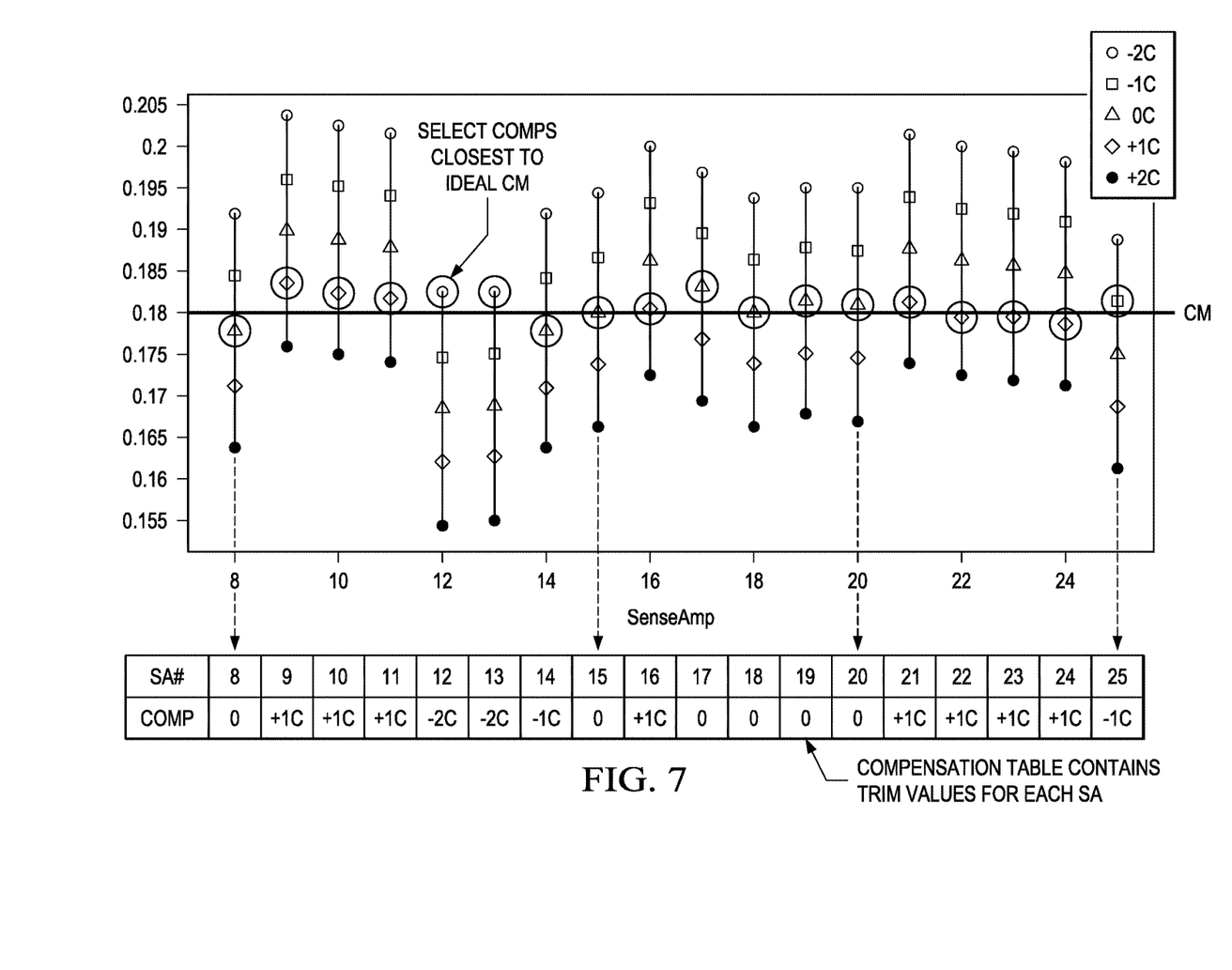
FIG. 7 is a diagram showing compensation data for 18 different sense amplifiers as determined by the method of FIG. 6.

FIG. 7 is a diagram showing compensation data for 18 different sense amplifiers as determined by the method of FIG. 6. The horizontal axis shows each sense amplifier number and the corresponding applied compensation. The vertical axis shows the corresponding positive or negative offset voltage of the sense amplifier with respect to the common mode level CM. Each vertical bar above a respective sense amplifier has five boxes corresponding to that sense amplifier. The center box shows the measured offset voltage. The two boxes above the center box show the effect of adding one or two compensation capacitors to LBLB. The two boxes below the center box show the effect of subtracting one or two compensation capacitors by adding them to LBL. The circled box of each vertical bar shows the offset value of the sense amplifier after the compensation in the bottom row is added or subtracted. For example, sense amplifier 8 has an uncompensated offset voltage (center box) slightly below level CM. Since it is closer to CM than any other box in the vertical bar, no compensation (0) is added. The initial offset voltage for sense amplifiers 9-11 is positive. Since the first box below the center box is closest to the CM level, one compensation capacitor (+1C) is added to LBL. Sense amplifier 12 has an initial negative offset voltage. Since the top box of the vertical bar is closest to the CM level, two compensation capacitors are subtracted (−2C) by adding two capacitors to LBLB. In this manner, all sense amplifiers are individually compensated in a memory circuit. The compensation values are stored in latch circuit 404 (FIG. 4A) or EFUSE circuit 416 (FIG. 4B). Signal-to-noise margin and reliability of the memory circuit are significantly improved.

Figure 8:
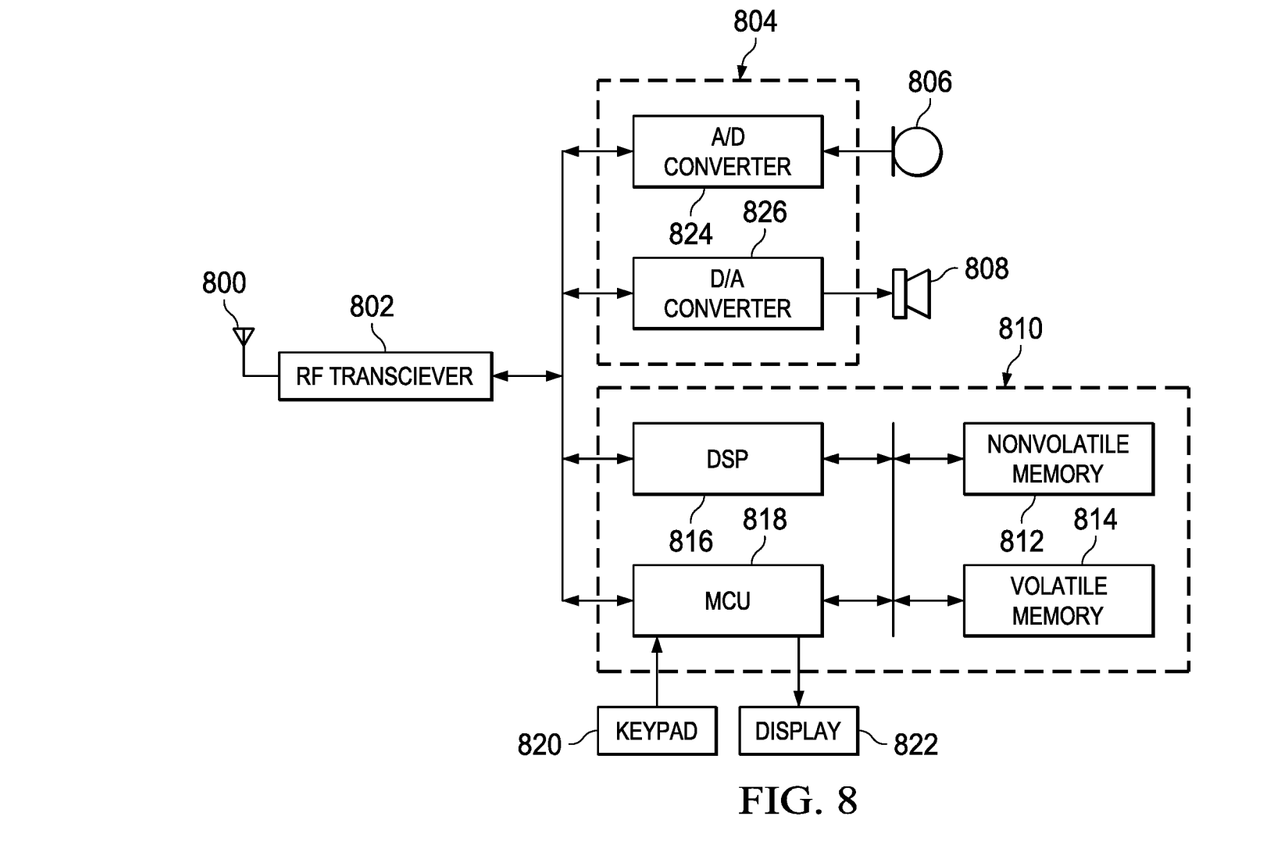
FIG. 8 is a block diagram of a wireless telephone as an example of a portable electronic device which may advantageously employ the present invention.

Referring to FIG. 8, there is a block diagram of a wireless telephone as an example of a portable electronic device which could advantageously employ this invention in a nonvolatile memory array. The wireless telephone includes antenna 800, radio frequency transceiver 802, base band circuits 810, microphone 806, speaker 808, keypad 820, and display 822. The wireless telephone is preferably powered by a rechargeable battery (not shown) as is well known in the art. Antenna 800 permits the wireless telephone to interact with the radio frequency environment for wireless telephony in a manner known in the art. Radio frequency transceiver 802 both transmits and receives radio frequency signals via antenna 800. The transmitted signals are modulated by the voice/data output signals received from base band circuits 810. The received signals are demodulated and supplied to base band circuits 810 as voice/data input signals. An analog section 804 includes an analog-to-digital converter 824 connected to microphone 806 to receive analog voice signals. The analog-to-digital converter 824 converts these analog voice signals to digital data and applies them to digital signal processor 816. Analog section 804 also includes a digital-to-analog converter 826 connected to speaker 808. Speaker 808 provides the voice output to the user. Digital section 810 is embodied in one or more integrated circuits and includes a microcontroller unit 818, a digital signal processor 816, nonvolatile memory circuit 812, and volatile memory circuit 814. Nonvolatile memory circuit 812 may include read only memory (ROM), ferroelectric memory (FeRAM or FRAM), FLASH memory, or other nonvolatile memory as known in the art. Volatile memory circuit 814 may include dynamic random access memory (DRAM), static random access memory (SRAM), or other volatile memory circuits as known in the art. Any of memory circuits 812 and 814 may advantageously employ sense amplifier compensation circuits according to the present invention. Microcontroller unit 818 interacts with keypad 820 to receive telephone number inputs and control inputs from the user. Microcontroller unit 818 supplies the drive function to display 822 to display numbers dialed, the current state of the telephone such as battery life remaining, and received alphanumeric messages. Digital signal processor 816 provides real time signal processing for transmit encoding, receive decoding, error detection and correction, echo cancellation, voice band filtering, etc. Both microcontroller unit 818 and digital signal processor 816 interface with nonvolatile memory circuit 812 for program instructions and user profile data. Microcontroller unit 818 and digital signal processor 816 also interface with volatile memory circuit 814 for signal processing, voice recognition processing, and other applications. Bus amplifier circuits of DSP 816 and MCU 818 may also advantageously employ amplifier compensation circuits according to the present invention.

Still further, while numerous examples have thus been provided, one skilled in the art should recognize that various modifications, substitutions, or alterations may be made to the described embodiments while still falling with the inventive scope as defined by the following claims. For example, the present invention may be applied to any amplifier circuit having a variation in offset voltage. For example, the present invention may advantageously be applied to input or bus amplifiers that must amplify small differential input signals. Furthermore, compensation may be extended to any practical number of compensation capacitors to increase compensation range or improve resolution. Other combinations will be readily apparent to one of ordinary skill in the art having access to the instant specification.

What is claimed is:

1. An integrated circuit device comprising:
    an sense amplifier having first and second input terminals;
    a compensation network including a first compensation circuit coupled to the first input terminal of the sense amplifier and a second compensation circuit coupled to the second input terminal of the sense amplifier; and
    a latch circuit operable to selectively enable either one of the first and second compensation circuits, but not both of the first and second compensation circuits simultaneously.

2. The integrated circuit device of claim 1, wherein the first compensation circuit includes a first capacitor coupled in series with a first transistor, and wherein the second compensation circuit includes a second capacitor coupled in series with a second transistor.

3. The integrated circuit device of claim 1, wherein the first compensation circuit includes a first plurality of capacitors each having a substantially same capacitance value, and wherein the second compensation circuit includes a second plurality of capacitors having a substantially same capacitance value.

4. The integrated circuit device of claim 1, wherein the first compensation circuit includes a first plurality of capacitors having binary weighted capacitance values, and wherein the second compensation circuit includes a second plurality of capacitors having the binary weighted capacitance values.

5. The integrated circuit device of claim 1, wherein the latch circuit is operable to provide a first control signal to the first compensation circuit and to provide a second control signal to the second compensation circuit.

6. The integrated circuit device of claim 5, wherein the first compensation circuit includes a first capacitor having a first capacitance value coupled in series with a first transistor that includes a gate terminal to receive the first control signal, and wherein the second compensation circuit includes a second capacitor having a second capacitance value coupled in series with a second transistor having a gate terminal to receive the second control signal.

7. The integrated circuit device of claim 6, wherein the first and second transistors are of the same conductivity type.

8. The integrated circuit device of claim 7, wherein the first and second transistors are both n-channel metal-oxide semiconductor (NMOS) transistors.

9. The integrated circuit device of claim 7, wherein the first and second control signals are complementary signals with respect to each other.

10. The integrated circuit device of claim 9, wherein the latch circuit is operable to provide a third control signal and a fourth control signal, and wherein the compensation network includes:
    a third compensation circuit coupled to the first input terminal of the sense amplifier and including a third capacitor having a third capacitance value coupled in series with a third transistor that includes a gate terminal to receive the third control signal; and
    a fourth compensation circuit coupled to the second input terminal of the sense amplifier and including a fourth capacitor having a fourth capacitance value coupled in series with a fourth transistor that includes a gate terminal to receive the fourth control signal;
    wherein the third and fourth transistors are of the same conductivity type and the third and fourth control signals are complementary signals with respect to each other.

11. The integrated circuit device of claim 10, wherein the first, second, third and fourth transistors are of the same conductivity type.

12. The integrated circuit device of claim 10, wherein the latch circuit is operable to selectively enable either one of the third and fourth compensation circuits, but not both of the third and fourth compensation circuits simultaneously.

13. The integrated circuit device of claim 10, wherein:
    the first and third capacitance values are different capacitance values;
    the second and fourth capacitance values are different capacitance values;
    the first and third transistors are separately controllable to enable adding of one or both of the first and third capacitance values to the first input terminal; and
    the second and fourth transistors are separately controllable to enable adding of one or both of the second and fourth capacitance values to the second input terminal.

14. The integrated circuit device of claim 10, wherein:
    the first and third capacitance value are equal;
    the second and fourth capacitance values are equal;
    the first and third transistors are separately controllable to enable adding of one or both of the first and third capacitance values to the first input terminal; and
    the second and fourth transistors are separately controllable to enable adding of one or both of the second and fourth capacitance values to the second input terminal.

15. The integrated circuit device of claim 1, wherein the latch circuit includes a plurality of electronic fuse circuits or a plurality of electronic antifuse circuits.

16. A system comprising:
 a processor;
 an input device coupled to the processor;
 an output device coupled to the processor;
 a memory array coupled to the processor; and
 a sense amplifier of the memory array, the sense amplifier comprising:
  a compensation network including a first compensation circuit coupled to a first input terminal of the sense amplifier and a second compensation circuit coupled to a second input terminal of the sense amplifier; and
  a latch circuit operable to selectively enable either one of the first and second compensation circuits, but not both of the first and second compensation circuits simultaneously.

17. The system of claim 16, wherein the first compensation circuit includes a first capacitor coupled in series with a first transistor, wherein the second compensation circuit includes a second capacitor coupled in series with a second transistor, and wherein the latch circuit is operable to provide a first control signal to the first compensation circuit via a gate terminal of the first transistor and to provide a second control signal to the second compensation circuit via a gate terminal of the second transistor.

18. The system of claim 17, wherein:
 the compensation network includes:
  a third compensation circuit having a third capacitor coupled in series with a third transistor; and
  a fourth compensation circuit having a fourth capacitor coupled in series with a fourth transistor; and
 wherein the latch circuit is operable to provide a third control signal to the third compensation circuit via a gate terminal of the third transistor and to provide a fourth control signal to the fourth compensation circuit via a gate terminal of the fourth transistor.

19. The system of claim 16, wherein the memory array includes ferroelectric memory cells.

\* \* \* \* \*